United States Patent [19]

Fujiyama et al.

[11] Patent Number: 5,079,548

[45] Date of Patent: Jan. 7, 1992

[54] DATA PACKING CIRCUIT IN VARIABLE LENGTH CODER

[75] Inventors: Takehiko Fujiyama; Toshiaki Usui, both of Kawasaki; Ryouichi Dangi, Chiba; Takashi Kawabata, Yokohama, all of Japan

[73] Assignee: Fujitsu Limited, Kanagawa, Japan

[21] Appl. No.: 585,702

[22] Filed: Sep. 19, 1990

[30] Foreign Application Priority Data

Sep. 20, 1989 [JP] Japan .................................. 1-241793

[51] Int. Cl.$^5$ ............................................. H03M 7/40
[52] U.S. Cl. ......................................... 341/67; 341/60
[58] Field of Search .............................. 341/60, 67, 81

[56] References Cited

U.S. PATENT DOCUMENTS

| 3,701,111 | 10/1972 | Cocke et al. | 341/67 |
| 4,376,933 | 3/1983 | Saran et al. | 341/60 |
| 4,914,675 | 4/1990 | Fedele | 341/67 |
| 4,963,867 | 10/1990 | Bertrand | 341/67 |

Primary Examiner—A. D. Pellinen
Assistant Examiner—Marc S. Hoff
Attorney, Agent, or Firm—Helfgott & Karas

[57] ABSTRACT

A data packing circuit, used in a variable length coder, for receiving code words including variable length codes and code length information of the variable length codes, and packing the variable length codes with no gaps into successive units of bits having predetermined length. The code word is shifted in a first direction by a number of bits equal to a shift number, and in parallel, the code word is shifted in a second direction opposite to the first direction by a number of bits equal to the difference between the predetermined length and the shift number, and zero is filled in each vacant bit which is generated by the above shift operations. The shift number is determined by accumulation of the code lengths by modulo-n addition, n being equal to the predetermined number, and a carry addition of the code lengths whether or not a carry occurs over the above predetermined length in the accumulated value. Logical sums of respective bits of the shifted result in the first direction and corresponding bits of the output of an intermediate date register are obtained. The intermediate data register latches the logical sums in every cycle of the code word when a carry is not detected in the above accumulation, and latches the shifted result in the second direction in every cycle of the code word when the carry is detected. The logical sums are latched as output data of the data packing circuit when the carry occurs.

5 Claims, 7 Drawing Sheets

DATA PACKING CIRCUIT IN VARIABLE LENGTH CODER

BACKGROUND OF THE INVENTION (1) Field of the Invention

The present invention relates to a data packing circuit, which is used in a variable length coder, for receiving code words including variable length codes, and successively packing the codes having variable lengths with no gaps into successive units of bits having a predetermined length, for example, successive bytes of data.

In data transmission systems wherein variable length coding is used, original data words are successively encoded into code words including variable length codes in the sender side, and the variable length codes (effective portions of the code words) having variable lengths are successively packed in byte or word lengths with no gaps for transmission through a transmission line with a high efficiency. In the receiver side, the above packed variable length codes, when received, are respectively unpacked into the code words having a byte length.

Generally, it is required to reduce the delay time in transmitting data in data transmission systems, and therefore, the reduction of the delay time is also required in the above operation of packing code words.

(2) Description of the Related Art

Figure 1:
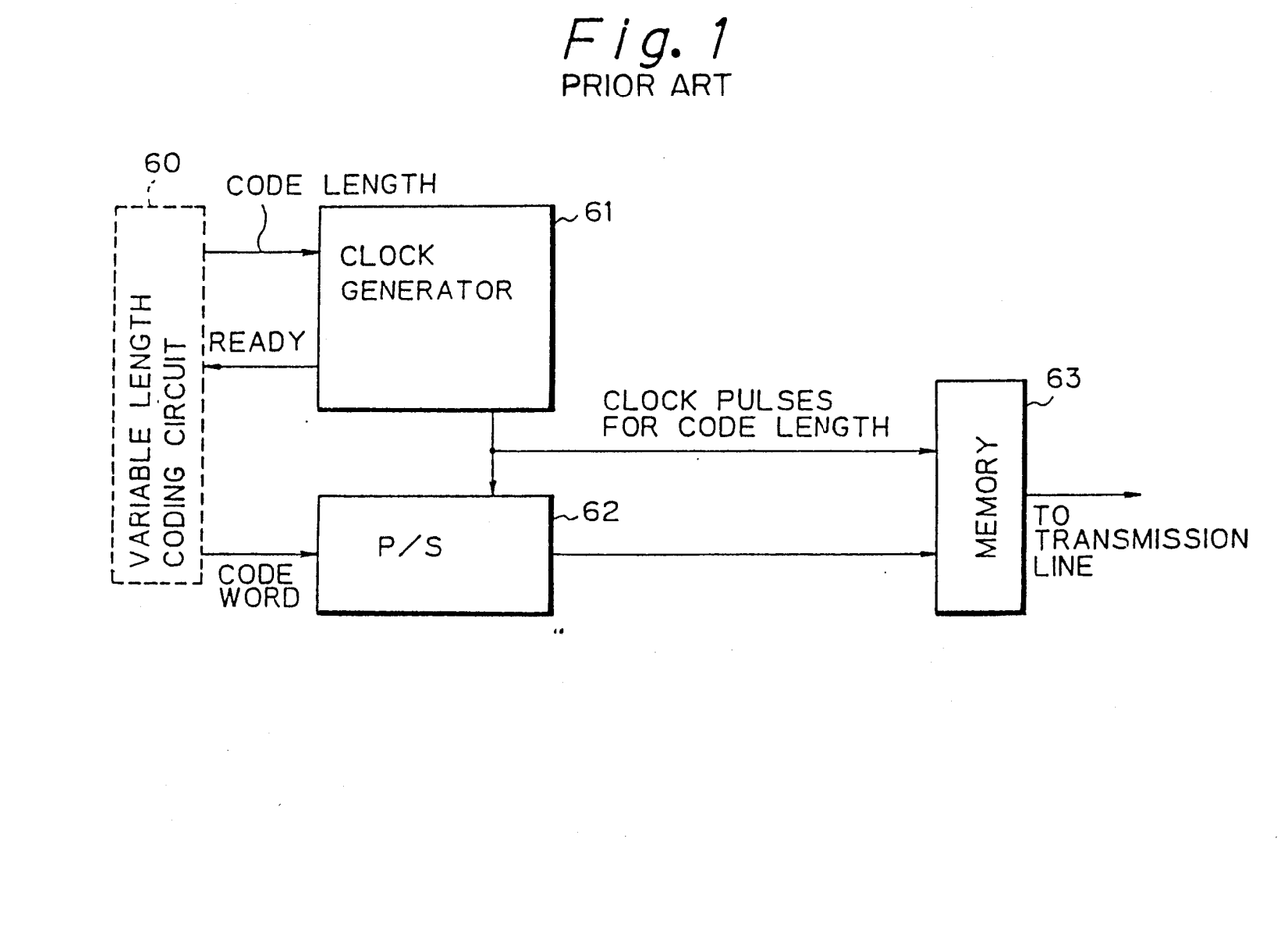
FIG. 1 shows a construction of a data packing circuit in a variable length coder in the prior art.

FIG. 1 shows a construction of a data packing circuit in a variable length coder in the prior art. In FIG. 1, reference numeral 60 denotes a variable length coding circuit, 61 denotes a clock generator, 62 denotes a parallel to serial conversion circuit, and 63 denotes a memory circuit. The variable length coding circuit 60 successively encodes original data words into code words including variable length codes, and outputs a code word in a parallel form together with information on the code length when receiving a READY signal. The code word output from the variable length coding circuit 60, is loaded in parallel in the shift register 62. The clock generator 61 generates a number of clock pulses, where the number is equal to the above code length, and the clock pulses are supplied to the parallel to serial conversion circuit 62 for providing timing for serially reading out each bit of the variable length code included in the above loaded code word. The code which is serially output from the parallel to serial conversion circuit 62 is written in the memory circuit 63. The above clock pulses are also supplied to the memory circuit 63 for providing timing for serially writing the above code in the memory circuit 63. As the number of the clock pulses is equal to the code length, only an effective portion of each code word, i.e., the variable length code is written in the memory circuit 63. The memory circuit 63 functions as a buffer memory, and the above serially output bits of the codes are successively written therein with no gaps, i.e., the codes are successively packed therein with no gaps. The packed codes are serially output from the memory circuit 63 at the transmission rate of the transmission line. When all bits of the codes loaded in the parallel to serial conversion circuit 62 is read out, the clock generator 61 outputs a READY signal to the variable length coding circuit 60 to load a next code word in the parallel to serial conversion circuit 62.

However, in the construction of FIG. 1, it takes much time to carry out the above packing operation mainly due to the use of the parallel to serial conversion of code words. The delay time in the above operation is an obstacle for a high-speed data transmission. To solve this problem, the frequency of the internal clock must be increased, but the increase in the frequency of the internal clock imposes severe requirements regarding the design of the circuitry for its high-speed operation. For example, high-speed and precise circuit elements must be used for the construction of the circuitry, and the use of the high-speed circuit elements has a tendency to increase power consumption. Therefore, the cost of constructing and using the circuitry is increased.

The Japanese Unexamined Patent Publication No. 61-265974 discloses a variable length coding apparatus wherein a ROM (read only memory) and a RAM (random access memory) are provided, the ROM memorizes all possible bit patterns of codes in all the possible bit-shifted forms, and the RAM holds codes packed with no gaps. When each code is packed in the RAM, the position to which the first bit of the following code is to be located for packing the following code with no gaps from the last bit of the above packed code, is memorized in a register, and the address for outputting a shifted bit pattern from the ROM is supplied to the ROM based on the following code and the above memorized position of the first bit of the following code. A logical sum of the output of the ROM and the last word in the RAM including the above memorized position is obtained in an OR gate set, and the output of the OR gate set is held in the RAM.

However, in the above construction, mainly due to the use of the ROM and the RAM, the scale of the circuitry and the cost of constructing the circuitry are large, and the delay time in packing data is not short.

SUMMARY OF THE INVENTION

An object of the present invention is to provide a data packing circuit used in a variable length coder for successively packing code words having variable lengths with no gaps into successive units of bits having a predetermined length, where the operation of the data packing is carried out in a short time, and the cost of constructing the circuitry is low.

According to the present invention, there is provided a data packing circuit, which is used in a variable length coder, for receiving code words including variable length codes and code length information of the variable length codes, and successively packing the variable length codes with no gaps into successive units of bits having a predetermined length, comprising a lower shifter, an upper shifter, the predetermined number of OR gates, a selector, an intermediate data register, a shift number determining circuit, a carry detecting circuit, and an output data register. The lower shifter shifts the above received code word in a first direction regarding the significance of bits by a number of bits equal to a shift number which is supplied from the shift number determining circuit, fills a zero in each vacancy bit which is generated by the shift, and outputs in parallel the result of the shifting and filling operation. The above upper shifter shifts the above received code word in a second direction which is opposite to the above first direction by a number of bits equal to the difference between the predetermined length and the shift number which is supplied from the shift number determining circuit, fills a zero in each vacancy bit which is generated by the shift, and outputs in parallel the result of the shifting and filling operation. The above shift number determining circuit receives the above code length information, and accumulates the received code lengths by modulo-n addition where n is equal to the predetermined number, to obtain the shift number. The above carry detecting means detects a carry over the predetermined length in the accumulating operation in the shift number determining circuit. The above predetermined number of OR gates respectively obtain logical sums of the respective bits of the parallel output of the lower shifter and corresponding bits of an output of the intermediate data register. The above selector receives the parallel output of the upper shifter and the parallel output of the OR gates, and selects the parallel output of the upper shifter as its parallel output when the carry is detected in the shift number determining circuit, and selects the outputs of the OR gates as its parallel output when the carry is not detected. The above intermediate data register latches the output of the selector at the same time as the code word is input in the lower shifter and the upper shifter. The above output data register latches the parallel output of the OR gates as output data of the data packing circuit when the carry is detected.

Figure 2:
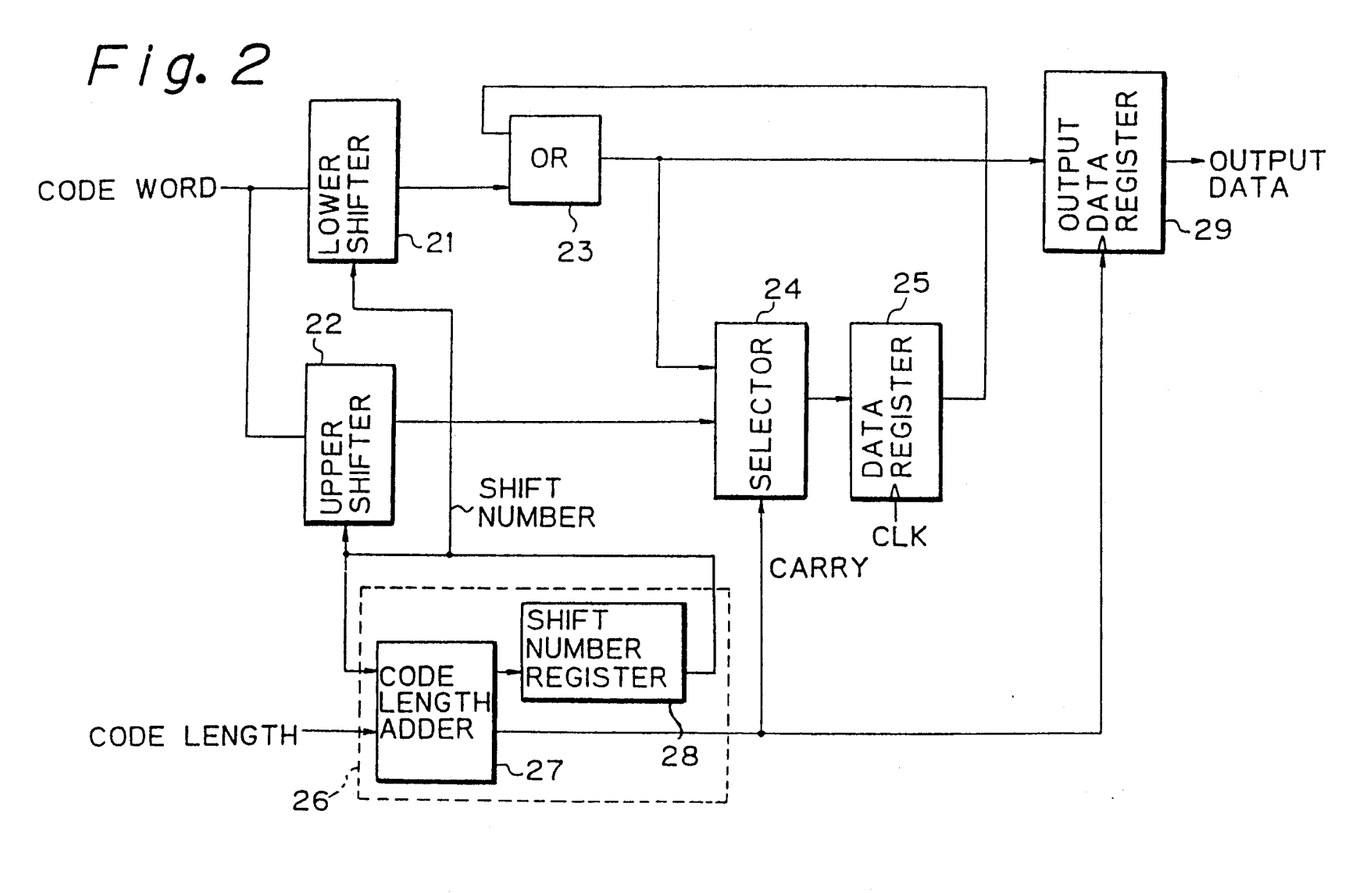
FIG. 2 shows the basic construction of the data packing circuit according to the present invention.

DESCRIPTION OF THE PREFERRED EMBODIMENTS (1) Basic Construction and Operations of the Present Invention FIG. 2 shows the basic construction of the data packing circuit according to the present invention, which is provided in the output stage of a variable length coding circuit. In FIG. 2, reference numeral 21 denotes a lower shifter, 22 denotes an upper shifter, 23 denotes an OR gate set, 24 denotes a selector, 25 denotes an intermediate data register, 26 denotes a shift number determining circuit, 27 denotes a code length adder, 28 denotes a shift number register, and 29 denotes an output data register. It is assumed that a code word having a predetermined length and including a variable length code therein, and code length information indicating the length of the variable length code, are supplied to the data packing circuit of FIG. 2. In addition, in each code word, the variable length code is located from the most significant bit of the word length.

The above code word having the predetermined length is applied in parallel to both the lower shifter 21 and the upper shifter 22. The lower shifter 21 shifts the received code word in the direction to less significant bits by a number of bits equal to a shift number which is supplied from the shift number determining circuit 26, and a zero is filled in each vacant bit which is generated by the above shift. The upper shifter 22 shifts the received code word in the direction to more significant bits by a number of bits equal to the difference between the above predetermined length and the above shift number which is supplied from the shift number determining circuit 26, and a zero is filled in each vacant bit which is generated by the shift. The above shifted results in the lower shifter 21 and the upper shifter 22 are respectively output in parallel therefrom.

The shift number determining circuit 26 receives the above code length information, and accumulates the received code lengths and divides the accumulated value by the above predetermined number, to obtain the above shift number, i.e., accumulates the received code lengths by modulo-n addition where n is equal to the predetermined number. The shift number determining circuit 26 further determines whether or not a carry occurs over the above predetermined length in the accumulated value. As shown in FIG. 2, the shift number determining circuit 26 may comprise the code length adder 27 and the shift number register 28. The code length adder 27 carries out modulo-n addition where n is the above predetermined number, for accumulating the code lengths and determining the carry, and the the above accumulated value is held in the shift number register 28 to output the value therefrom.

The OR gate set 23 contains a plurality of OR gates in parallel, where the number of the OR gates is equal to the above predetermined number, and logical sums of the respective bits of the parallel output of the lower shifter 21 and corresponding bits of the output of the intermediate data register 25, are obtained in the plurality of OR gates.

The selector 24 receives the parallel output of the upper shifter 22 and the parallel output of the OR gate set 23, and selects the parallel output of the upper shifter 22 as its parallel output when the above carry is detected in the shift number determining circuit 26, and selects the parallel output of the OR gate set 23 as its parallel output when the carry is not detected.

The intermediate data register 25 latches the output of the selector 24 at the same time as the above code word is input in the lower shifter 21 and the upper shifter 22.

The output data register 29 latches the parallel output of the OR gate set 23 as output data of the data packing circuit when the above carry occurs.

Since the initial value of the above accumulated value in the shift number determining circuit 26 is zero, the shift number is initially zero. Thus, the code word which is input in the lower shifter 21 is shifted by zero bit, and the code word which is input in the upper shifter 22 is shifted by the number of bits equal to (the above predetermined number)=(the above predetermined number)−(zero), and therefore, initially, the parallel output of the lower shifter 21 is the same as its parallel input, and all the bits of the parallel output of the upper shifter 22 are zero. Further, when the initial value of the content of the intermediate data register 25 is zero, the initial output of the OR gate set 23 is equal to the output of the lower shifter 21.

If a carry does not occur in the above initial state, i.e., the code length of the first code word is less than the above predetermined number, the selector 24 selects the output of the OR gate set 23, and the output of the selector 24 is latched in the intermediate data register 25 at the timing of a parallel input of a next code word to the data packing circuit.

The above next code word is input in the lower shifter 21, and is shifted by a number of bits in the direction to less significant bits, where the number is equal to the above shift number which is output from the shift number determining circuit 26 (and which is equal to the above code length of the first code word at this time). The code word is also input in the upper shifter 22, and is shifted by a number of bits equal to (the above predetermined number)−(the above shift number). Thus, the parallel output of the lower shifter 21 is inserted in the output of the OR gate set 23 from the next to the last bit of the first code (the least significant bit of the first code).

After the above stage, code words which are successively input in the data packing circuit, are packed one after another with no gaps through the loop comprised of the above lower shifter 21, the OR gate set 23, the selector 24, and the intermediate data register 25, and at the same time, a carry is detected at the shift number determining circuit 26 every time the accumulated number of the code lengths reaches the above predetermined number. The output of the OR gate set 23 is fully packed when a carry is detected, and the fully packed output of the OR gate set 23 is latched in the output data register 29 when a carry is detected.

When the carry is detected in the shift number determining circuit 26, the selector 24 selects the output of the upper shifter 22, and the selected output is latched in the intermediate data register 25. In the output of the upper shifter 22, a part of the bits of the last code which causes the above carry is included, where the part of the bits included in the output of the upper shifter 22 is a remainder of the bits which are included in the above output of the OR gate set 23. In the output of the upper shifter 22, the above part of the bits is located from the most significant bit of the output of the upper shifter 22. Thereafter, code words which are subsequently input into the data packing circuit, are also packed one after another with no gaps through the above-mentioned loop until the next carry is detected in the shift number determining circuit 26.

According to the above construction of the present invention, every code word is packed through the above loop comprised of the above lower shifter 21, the OR gate set 23, the selector 24, and the intermediate data register 25, and only one register (the intermediate data register 25) is included in the loop as a delay element which causes a delay of one clock cycle. Namely, every code can be packed in one clock cycle, and therefore, the delay time in the data packing operation is reduced compared with the prior art construction. Further, as explained below, the above basic construction is realized by simple circuitry at a low cost.

(2) Details of Preferred Embodiment

Figures 3A, 3B:
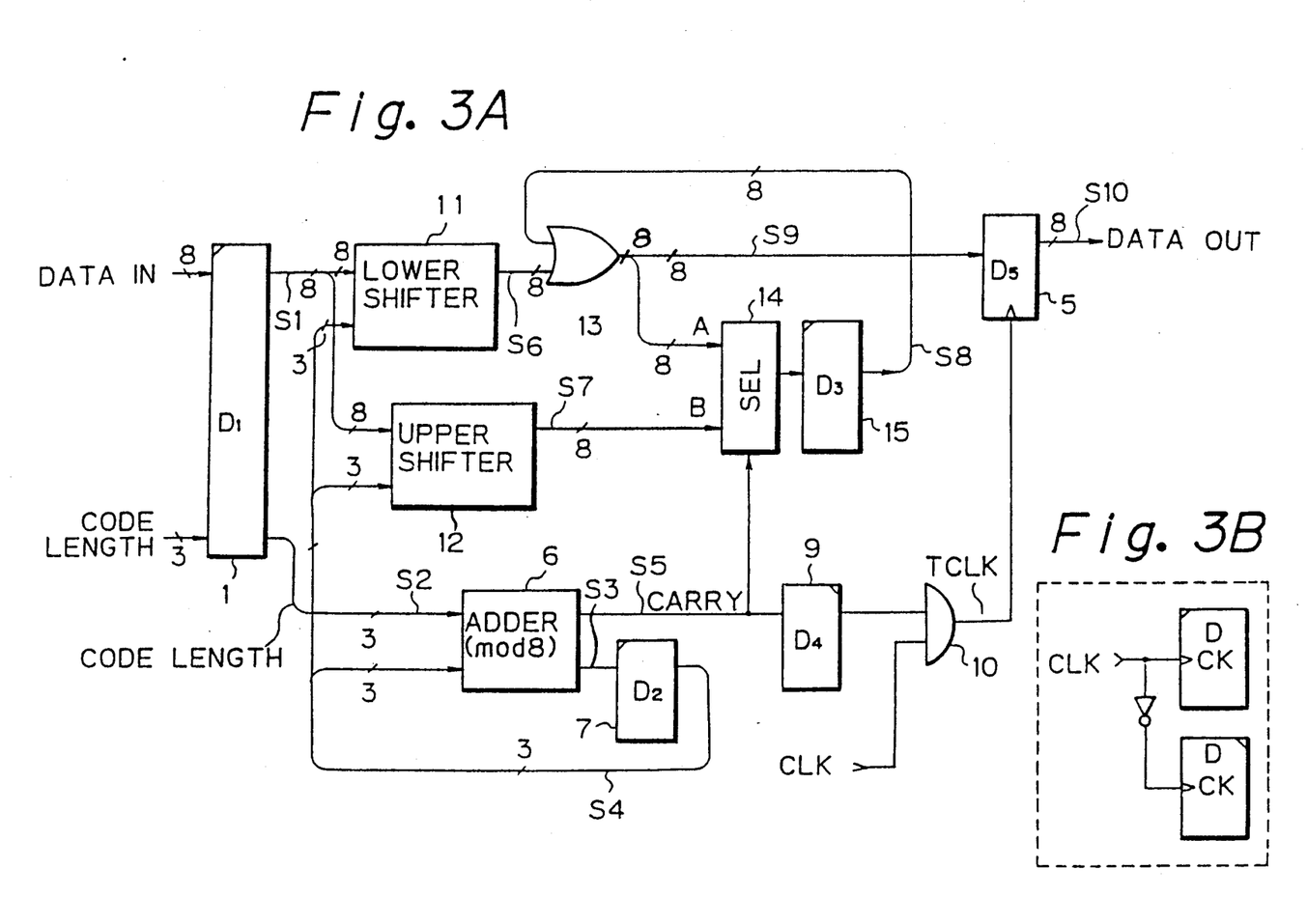
FIG. 3A shows the construction of an embodiment of the data packing circuit according to the present invention.
FIG. 3B shows the indications of D-type flip-flop circuits which respectively enter their inputs at the timing of a positive edge-triggered input and a negative edge-triggered input, in FIG. 3A.

FIG. 3A shows the construction of an embodiment of the data packing circuit according to the present invention. In FIG. 3A, reference numeral 1 denotes an input data register, 5 denotes an output data register, 6 denotes an adder, 7 denotes a shift number register, 9 denotes a delay circuit, 10 denotes an AND gate, 11 denotes a lower shifter, 12 denotes an upper shifter, 13 denotes an OR gate set, 14 denotes a selector, 15 denotes an intermediate data register, and CLK denotes a clock signal. FIG. 3B shows the indications of D-type flip-flop circuits which respectively enter their inputs at the timing of a positive edge-triggered input and a negative edge-triggered input, in FIG. 3A.

Similar to the above basic construction of FIG. 2, a code word having a byte length and including a variable length code therein, and code length information indicating the length of the variable length code, are supplied to the data packing circuit of FIG. 3A. The clock signal CLK synchronizes with the input timing of each code word and corresponding code length. The code word and the corresponding code length are latched in the input data register 1 at the rising of the clock signal CLK. In addition, in each code word, the variable length code having the variable length is located from the most significant bit of the word length.

The above code word latched in the input data register 1 is applied in parallel to both the lower shifter 11 and the upper shifter 12. The lower shifter 11 shifts the received code word in the direction to less significant bits by a number of bits equal to a shift number which is supplied from the shift number register 7, and a zero is filled in each vacant bit which is generated by the above shift. By the shift operation of the lower shifter 11, the first bit of the newly received code (word) is shifted to the position next to the last bit of preceding codes which have been already packed with no gaps. The upper shifter 12 shifts the received code word in the direction to more significant bits by a number of bits equal to the difference between the above byte length (eight) and the above shift number which is supplied from the shift number register 7, and a zero is filled in each vacant bit which is generated by the shift. The upper shifter 12 is provided for shifting a remaining part of the bits of the last code all bits of which can not be included in a preceding output data byte, to the beginning position of the next output data byte. The above shifted results in the lower shifter 11 and the upper shifter 12 are respectively output in parallel therefrom.

The adder 6 is modulo-eight adder, that receives the above code length information from the input data register 1 and the output of the shift number register 7, accumulates the received code lengths and divides the accumulated value by the above byte length (eight), to obtain the above shift number. The shift number adder 6 further detects whether or not a carry occurs over the above byte length in the accumulated value.

The OR gate set 13 contains eight OR gates in parallel, and logical sums of the respective bits of the parallel output of the lower shifter 11 and corresponding bits of the output of the intermediate data register 15, are obtained from the eight OR gates.

The selector 14 receives the parallel output of the upper shifter 12 and the parallel output of the OR gate set 13, and selects the parallel output of the upper shifter 12 as its parallel output when the above carry is detected in the adder 6, and selects the parallel output of the OR gate set 13 as its parallel output when the carry is not detected.

The intermediate data register 15 latches the output of the selector 14 at the rising time of the clock CLK (at the same time as the above code word is input in the lower shifter 11 and the upper shifter 12).

The output data register 5 latches the parallel output of the OR gate set 13 as output data of the data packing circuit at the rising time of the clock when the above carry occurs. The timing is supplied to the output data register 5 from the AND gate 10. The carry output from the adder 6, which is denoted by S5 in FIG. 3A, is delayed by a half cycle of the clock signal CLK through the delay circuit (D-type flip-flop circuit) 9, and is then applied to the AND gate 10. The AND gate 10 further receives the clock signal CLK, and the output TCLK of the AND gate 10 rises at the rising time of the clock when the carry signal S5 is active. Namely, the output TCLK of the AND gate 10 is used as an output clock.

As readily understood from the correspondence between the above construction of FIG. 3A and the construction of FIG. 2, similar to the construction of FIG. 2, code words which are successively input in the data packing circuit, are packed one after another with no gaps through a loop comprised of the above lower shifter 11, the OR gate set 13, the selector 14, and the intermediate data register 15, and at the same time, a carry is detected at the adder 7 every time the accumulated number of the code lengths reaches eight. The output of the OR gate set 13 is fully packed when a carry is detected, and the fully packed output of the OR gate set 13 is latched in the output data register 5 when the output of the AND gate 10 rises.

When the carry is detected in the adder 7, the selector 14 selects the output of the upper shifter 12, and the selected output is latched in the intermediate data register 15. In the output of the upper shifter 12, a part of the bits of the last code which causes the above carry is included, where the part of the bits included in the output of the upper shifter 12 is a remainder of the bits which are included in the above output of the OR gate set 13. In the output of the upper shifter 12, the above part of the bits is located from the most significant bit of the output of the upper shifter 12. Thereafter, code words which are subsequently input into the data packing circuit, are packed one after another with no gaps through the above-mentioned loop until the next carry is detected in the adder 7. Every code word is packed through the above loop comprised of the above lower shifter 11, the OR gate set 13, the selector 14, and the intermediate data register 15, and when the output of the OR gate set 13 is fully packed, the fully packed data byte is immediately latched in and output from the output data register 5. Namely, every code can be packed in one clock cycle, and therefore, the delay time in the data packing operation is reduced compared with the prior art construction, and the above construction of FIG. 3A is realized by simple circuitry at a low cost.

(3) Details of the Lower Shifter and the Upper Shifter

Figure 4:
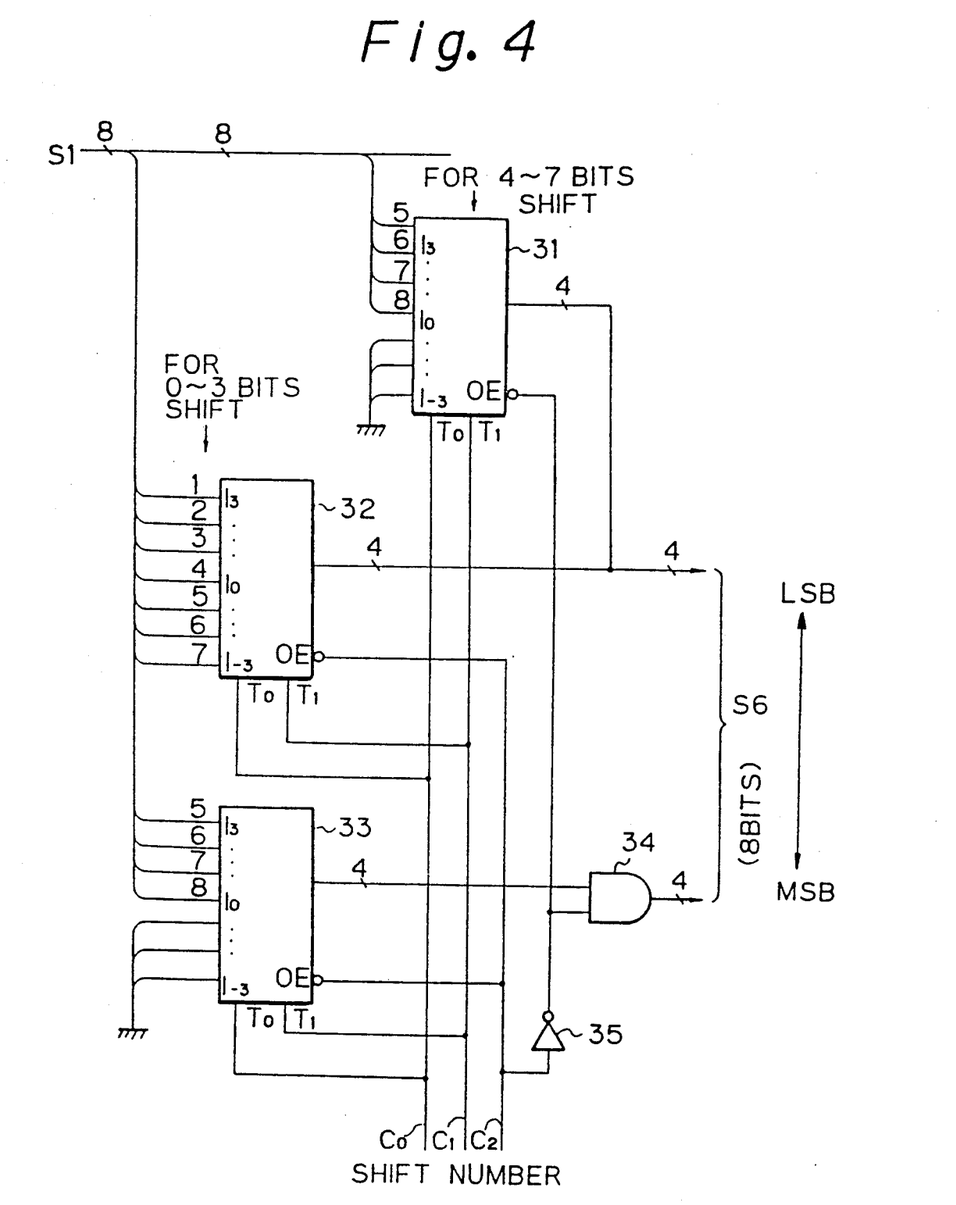
FIG. 4 shows an example of the construction of the lower shifter in the construction of FIG. 3A.
Figure 5A:
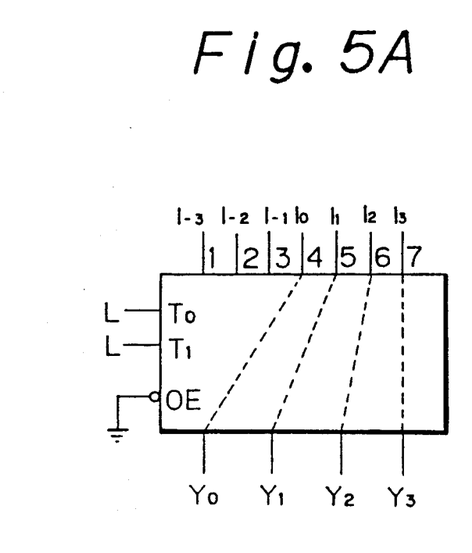
FIGS. 5A to 5D shows the operations of bit shifter used in the construction of FIGS. 4 and 6.
Figure 5B:
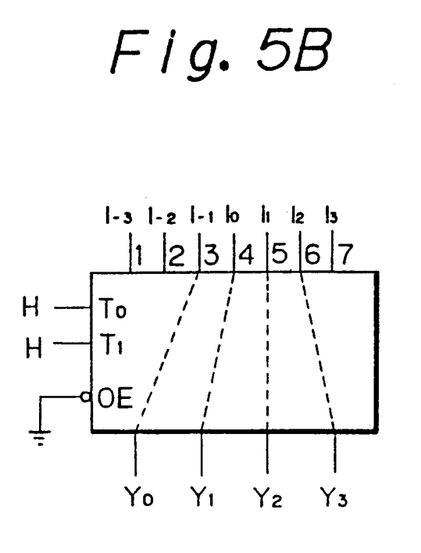
Figure 5C:
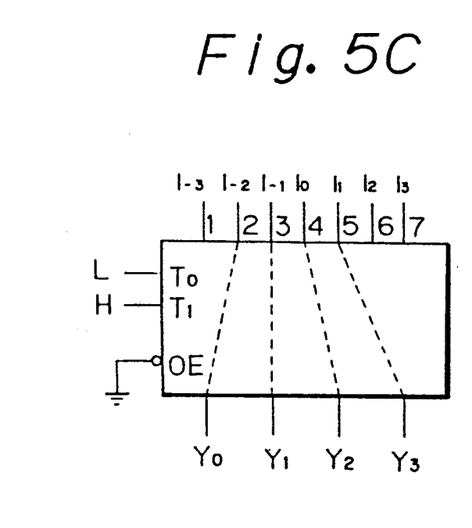
Figure 5D:
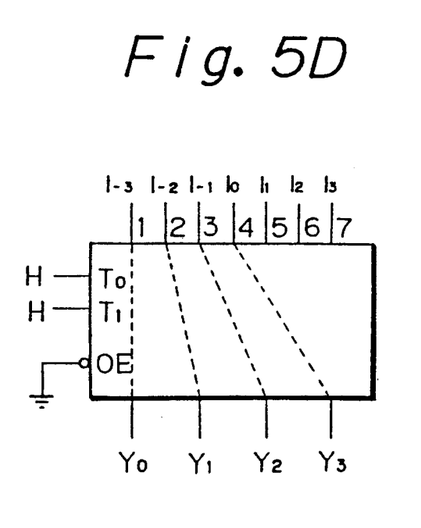

FIG. 4 shows an example of the construction of the lower shifter 11 in the construction of FIG. 3A. In FIG. 4, reference numerals 31, 32, and 33 each denote a bit shifter, 34 denotes an AND gate set, and 35 denotes an inverter. The bit shifters 31, 32, and 33 respectively have seven data input terminals $I_{-3}$, $I_{-2}$, $I_{-1}$, $I_0$, $I_1$, $I_2$, and $I_3$, two control input terminals $T_0$ and $T_1$, an output enable control input terminal OE, and four data output terminals $Y_0$, $Y_1$, $Y_2$, and $Y_3$, and operate as shown in FIGS. 5A to 5D. Namely, four successive input bits are selected as an output comprised of four bits according to the control input comprised of two bits when receiving a negative (active) signal at its output enable control input terminal OE. The bit shifter as shown in FIG. 5A to 5D is commercially available.

Seven bits from the least significant bit (which are denoted by bit Nos. 1 to 7 in FIG. 4) of the data output S1 of the input data register 1, are input into the seven data input terminals $I_3$, $I_2$, $I_1$, $I_0$, $I_{-1}$, $I_{-2}$, and $I_{-3}$ of the bit shifter 32, four bits from the most significant bit (which are denoted by bit Nos. 8 to 5 in FIG. 4) of the data output S1 of the input data register 1, are input into the four data input terminals $I_0$, $I_1$, $I_2$, and $I_3$ of both the bit shifters 31 and 33, and three bits of the data input terminals $I_{-1}$, $I_{-2}$, and $I_{-3}$ of both the bit shifters 31 and 33 are connected to the earth level.

In FIG. 4, $C_0$, $C_1$, and $C_2$ denote three bits of the signal lines which supply the shift number which is output from the shift number register 7. Two bits $C_0$ and $C_1$ from the least significant bit are applied to the two control input terminals $T_0$ and $T_1$ of all the bit shifters 31, 32, and 33, and the bit $C_2$ is applied directly to the output enable control input terminals OE of both the bit shifters 32 and 33, and to the output enable control input terminals OE of the bit shifters 31 after being logically inverted by the inverter 35. Since the bit $C_2$ is "1" when the shift number is 4 to 7, the bit shifter 31 operates when the shift number is 4 to 7, and the bit shifters 32 and 33 operate when the shift number is 0 to 3.

Each of the four output bits from the bit shifter 31 and the corresponding output bit from the bit shifter 32 are wired-OR connected to generate one of four bits from the least significant bit of the output S6 of the lower shifter 11. Four output bits from the bit shifter 33 are output through the AND gate set 34 to generate four bits from the most significant bit of the output S6 of the lower shifter 11. The AND gate set 34 contains four AND gates in parallel to generate a logical multiplication of each bit of the four output bits from the bit shifter 33 and the output of the inverter 35 which is the inversion of the above bit $C_2$.

When the shift number is 0 to 3, for example, when the shift number is two, the third to sixth bits from the least significant bit of the data output of the input data register 1 are output from the bit shifter 32, and the seventh and eighth bits from the least significant bit of the data output of the input data register 1 and two "0" bits of the earth level are output from the bit shifter 33 to the AND gate set 34. Since the bit $C_2$ is "0", the output of the bit shifter 33 is output through the AND gate set 34. Thus, the third to eighth bits of the data output of the input data register 1 followed by the two "0" bits are output from the circuit of FIG. 4. Namely, the data output of the input data register 1 is shifted by two bits in the direction to more significant bits in the construction of FIG. 4.

When the shift number is 4 to 7, for example, when the shift number is six, the seventh and eighth bits from the least significant bit of the data output of the input data register 1 are output from the bit shifter 31, and all the output bits of the AND gate set 34 are "0" since the bit $C_2$ is "1". Thus, the data output of the input data register 1 is shifted by six bits in the direction to more significant bits in the construction of FIG. 4.

Figure 6:
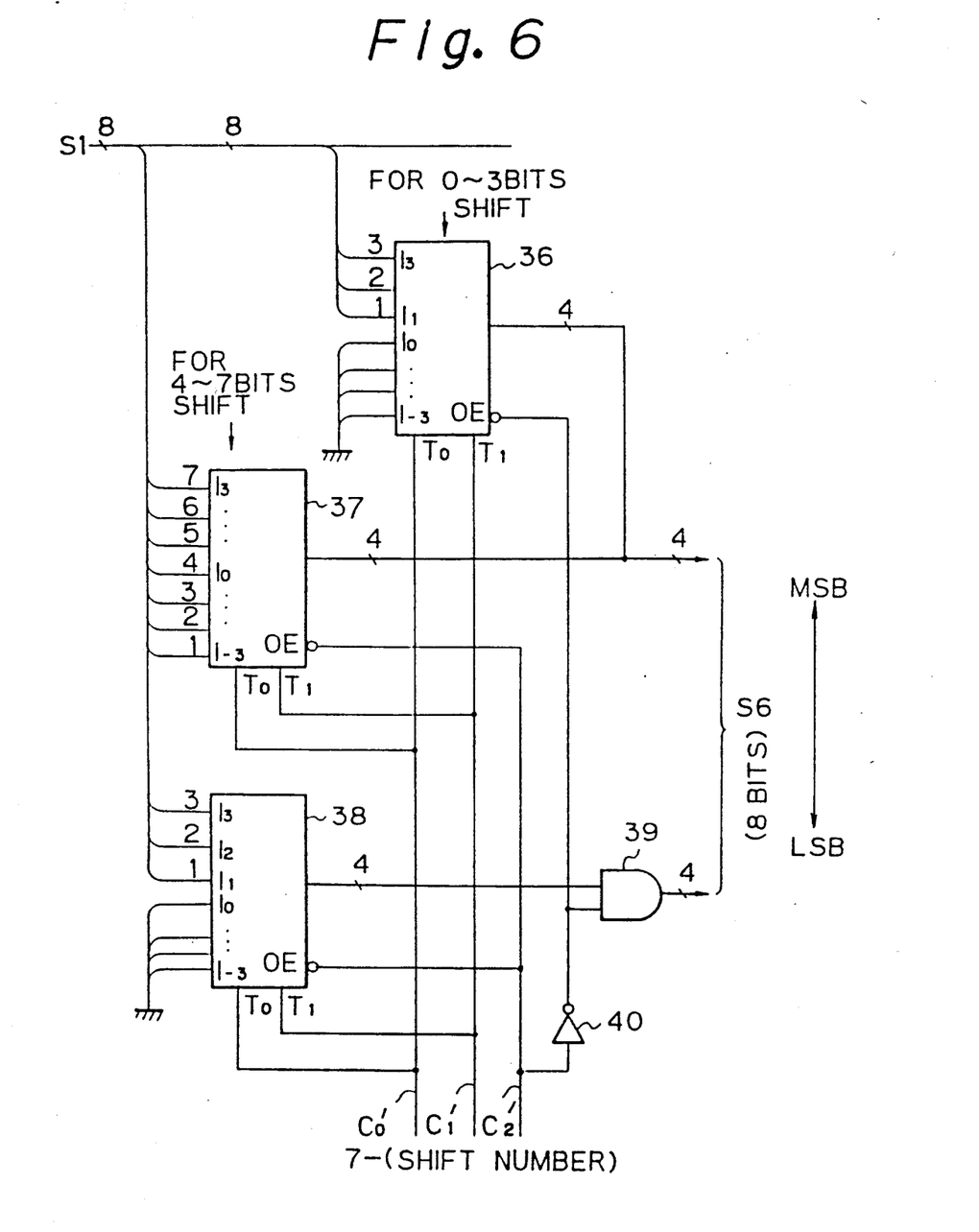
FIG. 6 shows an example of the construction of the upper shifter in the construction of FIG. 3A.

FIG. 6 shows an example of the construction of the upper shifter 12 in the construction of FIG. 3A. In FIG. 6, reference numeral 36, 37, and 38 each denote a bit shifter, 39 denotes an AND gate set, and 40 denotes an inverter. The bit shifters 36, 37, and 38 respectively have the construction as shown in FIG. 5A to 5D.

Seven bits from the most significant bit (which are denoted by bit Nos. 7 to 1 in FIG. 6) of the data output S1 of the input data register 1, are input into the seven data input terminals $I_3$, $I_2$, $I_1$, $I_0$, $I_{-1}$, $I_{-2}$, and $I_{-3}$ of the bit shifter 37, three bits from the least significant bit (which are denoted by bit Nos. 3 to 1 in FIG. 6) of the data output S1 of the input data register 1, are input into the three data input terminals $I_3$, $I_2$, and $I_1$ of both the bit shifters 36 and 38, and four bits of the data input terminals $I_0$, $I_{-1}$, $I_{-2}$, and $I_{-3}$ of both the bit shifters 31 and 33 are connected to the earth level.

In FIG. 6, $C_0'$, $C_1'$, and $C_2'$ denote three bits of signal lines which supply the number which is equal to (seven-the shift number). Two bits $C_0'$ and $C_1'$ from the least significant bit are applied to the two control input terminals $T_0$ and $T_1$ of all the bit shifters 36, 37, and 38, and the bit $C_2'$ is applied directly to the output enable control input terminals OE of both the bit shifters 37 and 38, and to the output enable control input terminals OE of the bit shifters 36 after being logically inverted by the inverter 40. Since the bit $C_2'$ is "1" when the shift number is 0 to 3, the bit shifter 36 operates when the shift number is 0 to 3, and the bit shifters 37 and 38 operate when the shift number is 4 to 7.

Each of the four output bits from the bit shifter 36 and the corresponding output bit from the bit shifter 37 are wired-OR connected to generate one of four bits from the most significant bit of the output S7 of the upper shifter 12. Four output bits from the bit shifter 33 are output through the AND gate set 34 to generate four bits from the least significant bit of the output S7 of the upper shifter 12. The AND gate set 40 contains four AND gates in parallel to generate a logical multiplication of each bit of the four output bits from the bit shifter 38 and the output of the inverter 40 which is the inversion of the above bit $C_2'$.

When the shift number is 0 to 3, for example, when the shift number is two, the least significant bit of the data output of the input data register 1 is output from the bit shifter 36, and all the output bits of the AND gate set 40 are "0" since the bit $C_2'$ is "1". Thus, the data output of the input data register 1 is shifted by six bits in the direction to more significant bits in the construction of FIG. 4.

When the shift number is 4 to 7, for example, when the shift number is six, the third to sixth bits from the least significant bit of the data output of the input data register 1 are output from the bit shifter 37, and the least significant bit and the next (second) bit of the data output of the input data register 1 and two "0" bits of the earth level are output from the bit shifter 38 to the AND gate set 39. Since the bit $C_2'$ is "0", the output of the bit shifter 38 is output through the AND gate set 39. Thus, the sixth to second bits of the data output of the input data register 1 followed by the two "0" bits are output from the circuit of FIG. 6. Namely, the data output of the input data register 1 is shifted by two bits in the direction to more significant bits in the construction of FIG. 6.

(4) Timing of the Construction of FIG. 3A

Figure 7:
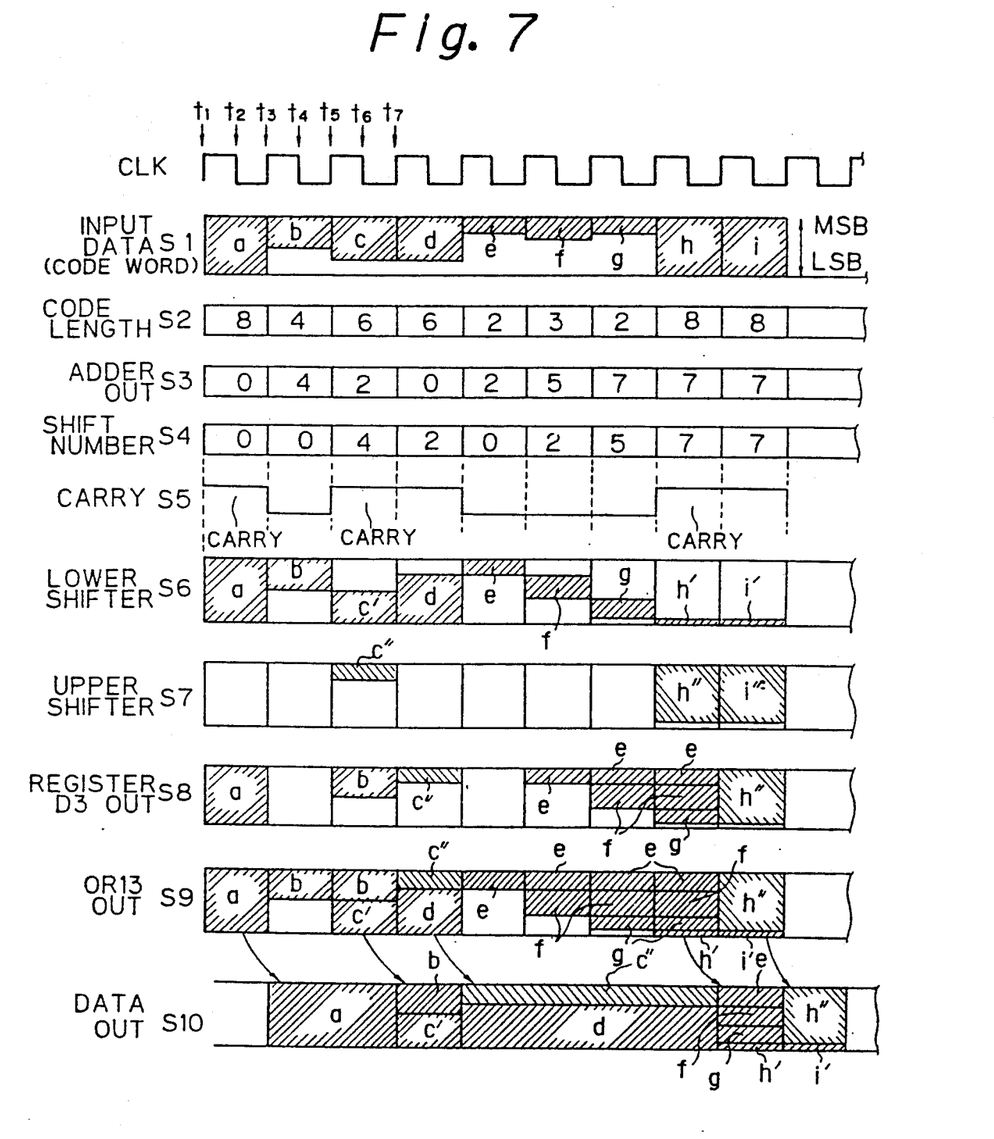
FIG. 7 shows an example of the timing in the operation of the construction of FIG. 3A.

FIG. 7 shows an example of the timing in the operation of the construction of FIG. 3A. In FIG. 7, reference numeral S1 denotes the input data (code word) which is output from the input data register 1, S2 denotes the code length which is output from the input data register 1, S3 denotes the output of the adder 6 which indicates the result of the modulo-eight addition, S4 denotes the output of the shift number register 7, S5 denotes the carry signal which is output from the adder 6, S6 denotes the output of the lower shifter 11, S7 denotes the output of the upper shifter 12, S8 denotes the output of the intermediate data register 15, S9 denotes the output of the OR gate set 13, S10 denotes the output of the output data register 5, and a, b, c, d, e, f, g, h, and i each denote a code which is included in a code word. Further, c' denotes a part of the bits of the code c, and c'' denotes a remaining part of the code c; h' denotes a part of the bits of the code h, and h'' denotes a remaining part of the code h; and i' denotes a part of the bits of the code i, and i'' denotes a remaining part of the code i.

In the initial state, the output S3 of the adder 6 and the output of the shift number register 7 are both zero. In the example of FIG. 7, in the initial state, at the time $t_1$, a code word including a code a having a code length of eight is output from the input data register 1 together with the code length eight. Since the code length is eight, the adder 6 outputs an active carry signal S5, and the shift number S4 which is equal to zero by the modulo-eight addition. Since the shift number S4 is zero, no bit shift occurs in the lower shifter 11, and an eight bit shift is carried out in the upper shifter 12. Therefore, the above code a is output as is from the lower shifter 11, and all the output bits of the upper shifter 12 are zero. Further, since the output of the intermediate data register 15 is zero in the initial state, the above code a is output from the OR gate set 13 as is. Since the carry signal S5 is active, the output TCLK of the AND gate 10 rises when the clock rises next at the time $t_3$. Due to the rising of the clock TCLK, the output (the code a) of the OR gate set 13 is latched in the output data register 5 at that timing. Further, the selector 14 selects the output of the upper shifter 12 due to the above active carry signal S5.

Corresponding to the above rising of the clock CLK at the time $t_3$, the next code word including a code b having a code length equal to four is latched in the input data register 1 together with the code length four. At the same time, the above output of the selector 14, which is zero at this time, is latched in the intermediate data register 15, and the above zero output S3 of the adder 6 is latched in the shift number register 7 to make the output S4 of the shift number register 7 zero.

Since the above shift number S4 is zero, no bit shift occurs in the lower shifter 11, and an eight bit shift is carried out in the upper shifter 12. Therefore, the above code word including the code b is output as is from the lower shifter 11, and all the output bits of the upper shifter 12 are zero. Further, since the output of the intermediate data register 15 is zero as explained above, the above code word is output from the OR gate set 13 as is. Since the carry signal S5 is inactive, the output TCLK of the AND gate 10 does not rise in this cycle of the clock CLK, and therefore, the output (the code a) of the OR gate set 13 is not latched in the output data register 5 in this cycle. Further, the selector 14 selects the output of the lower shifter 11 due to the above inactive carry signal S5.

Then, the clock signal CLK rises at the time $t_5$. Corresponding to the rising of the clock CLK, the next code word including a code c having a code length equal to six is latched in the input data register 1 together with the code length six. At the same time, the above output of the selector 14, which is equal to the previous code word including the code b, is latched in the intermediate data register 15, and the above output S3 of the adder 6, which is equal to four, is latched in the shift number register 7 to make the output S4 of the shift number register 7 four.

Since the above shift number S4 is four, a bit shift operation by four bits in the direction to the less significant bits is carried out in the lower shifter 11, and four (8−4=4) bit shift in the direction to the more significant bits is carried out in the upper shifter 12. Therefore, four bits from the most significant bit in the output of the lower shifter 11 are zero, and four bits c' from the most significant bit of the code c are output from the remaining four bits of the output of the lower shifter 11, and the remaining bits c'' of the code c appear in the two bits from the most significant bit of the output of the upper shifter 12. Since both the above outputs of the intermediate data register 15 and the lower shifter 11 are received in the OR gate set 13, the above four bits c' from the most significant bit of the code c are packed just after the last bits of the code b in the output of the OR gate set 13. The adder 6 adds the above code length (six) to the output (four) of the shift number register 7 by the modulo-eight addition, and outputs the number two as the S3 signal, and an active carry signal S5. Corresponding to the active carry signal S5, the output TCLK of the AND gate 10 rises at the time $t_7$, and therefore, the above output (a, c') of the OR gate set 13 is latched in the output data register 5 at this time. Further, the selector 14 selects the output of the upper shifter 12 due to the above active carry signal S5.

Operations similar to the above are carried out after the time $t_7$, as shown in FIG. 7.

As shown in FIG. 7, according to the present invention, each input code word can be processed in every cycle of the clock signal, and therefore, the processing time is reduced without increasing the frequency of the clock signal. In addition, the constructions of FIGS. 2 and 3A can be realized using simple circuit elements only, and therefore, the cost for constructing the data packing circuit according to the present invention is low.

We claim:

1. A data packing circuit, which is used in a variable length coder, for receiving code words including variable length codes and code length information of the variable length codes, and successively packing the variable length codes with no gaps into successive units of bits having a predetermined length, the circuit comprising a lower shifter means, an upper shifter means, a predetermined number of OR gates, a selector, an intermediate data register, a shift number determining means, a carry detecting means, and an output data register;

said lower shifter means shifting the received code word in a first direction regarding the significance of bits by a number of bits equal to a shift number which is supplied from said shift number determining means, filling a zero in each vacant bit which is generated by said shift, and outputting in parallel the result of said shifting and filling;

said upper shifter means shifting the received code word in a second direction which is opposite to said first direction by a number of bits equal to the difference between said predetermined length and said shift number which is supplied from said shift number determining means, filling a zero in each vacant bit which is generated by said shift, and outputting in parallel the result of said shifting and filling;

said shift number determining means receiving said code length information, and accumulating the received code lengths by modulo-n addition where n is equal to a predetermined number corresponding to the number of said OR gates, to obtain said shift number;

said carry detecting means detecting a carry over said predetermined length in said accumulating operation in said shift number determining means;

said predetermined number of OR gates respectively obtaining logical sums of the respective bits of a parallel output of said lower shifter means and corresponding bits of an output of said intermediate data register;

said selector receiving a parallel output of said upper shifter means and a parallel output of said OR gates, and selecting the parallel output of said upper shifter means as its parallel output when said carry is detected in said shift number determining means, and selecting the output of said OR gates as its parallel output when said carry is not detected;

said intermediate data register latching the output of said selector at the same time as said code word is input in said lower shifter means and said upper shifter means; and said output data register latching the parallel output of said OR gates as output data of the data packing circuit when said carry is detected.

2. A data packing circuit according to claim 1, and further comprising an output timing generating means for generating a timing signal to latch the output of said OR gates to obtain each of said units of bits having a predetermined length wherein said codes are successively packed with no gaps.

3. A data packing circuit according to claim 1, wherein said first direction is a direction to more significant bits in said predetermined length of bits, and said second direction is a direction to less significant bits in said predetermined length of bits.

4. A data packing circuit according to claim 1, wherein said predetermined length is a byte.

5. A data packing circuit, which is used in a variable length coder, for receiving code words including variable length codes and code length information of the variable length codes, and successively packing the variable length codes with no gaps into successive units of bits having a predetermined length, comprising a lower shifter means, an upper shifter means, a predetermined number of OR gates, a selector, an intermediate data register, a code length adding means, a carry detecting means, a shift number register, and an output data register;

said lower shifter means shifting the received code word in a first direction regarding the significance of bits by a number of bits equal to a shift number which is supplied from said shift number register, filling a zero in each vacant bit which is generated by said shift, and outputting in parallel the result of said shifting and filling operation;

said upper shifter means shifting the received code word in a second direction which is opposite to said first direction by a number of bits equal to the difference between said predetermined length and said shift number which is supplied from said shift number register, filling a zero in each vacant bit which is generated by said shift, and outputting in parallel the result of said shifting and filling operation;

said code length adding means receiving said code length information, and accumulating the received code lengths by modulo-n addition where n is equal to a predetermined number corresponding to the number of said OR gates, to obtain said shift number;

said carry detecting means detecting a carry over said predetermined length in said accumulating operation in said code length adding means;

said predetermined number of OR gates respectively obtaining logical sums of the respective bits of a parallel output of said lower shifter means and corresponding bits of an output of said intermediate data register;

said selector receiving a parallel output of said upper shifter means and a parallel output of said OR gates, and selecting the parallel output of said upper shifter means as its parallel output when said carry is detected in said carry detecting means, and selecting the output of said OR gates as its parallel output when said carry is not detected;

said intermediate data register latching the output of said selector at the same time as said code word is input in said lower shifter means and said upper shifter means; and said output data register latching the parallel output of said OR gates as output data of the data packing circuit when said carry is detected.

* * * * *